(12) United States Patent
Lee (10) Patent No.: US 12,266,501 B2
(45) Date of Patent: Apr. 1, 2025

(54) NANOPOSITIONING SYSTEMS AND ASSOCIATED METHODS

(71) Applicant: The Texas A&M University System, College Station, TX (US)

(72) Inventor: ChaBum Lee, College Station, TX (US)

(73) Assignee: The Texas A&M University System, College Station, TX (US)

( * ) Notice: Subject to any disclaimer, the term of this patent is extended or adjusted under 35 U.S.C. 154(b) by 406 days.

(21) Appl. No.: 17/780,422

(22) PCT Filed: Nov. 27, 2020

(86) PCT No.: PCT/US2020/062508
§ 371 (c)(1),
(2) Date: May 26, 2022

(87) PCT Pub. No.: WO2021/108770
PCT Pub. Date: Jun. 3, 2021

(65) Prior Publication Data
US 2023/0009873 A1 Jan. 12, 2023

Related U.S. Application Data

(60) Provisional application No. 63/053,184, filed on Jul. 17, 2020, provisional application No. 62/941,339, filed on Nov. 27, 2019.

(51) Int. Cl.
*G01Q 10/04* (2010.01)
*F16M 11/04* (2006.01)
(Continued)

(52) U.S. Cl.
CPC ............ *H01J 37/20* (2013.01); *F16M 11/043* (2013.01); *F16M 11/18* (2013.01); *F16M 11/22* (2013.01);
(Continued)

(58) Field of Classification Search
None
See application file for complete search history.

(56) References Cited

U.S. PATENT DOCUMENTS

2009/0114158 A1 5/2009 Zucker et al.
2015/0047078 A1* 2/2015 Sarkar .................... G01Q 20/04
850/1

(Continued)

FOREIGN PATENT DOCUMENTS

CN 101911281 A 12/2010
EP 2069669 B1 5/2013
KR 10-2019-0003723 A 1/2019

OTHER PUBLICATIONS

International Search Report and Written Opinion dated Mar. 23, 2021 for Application No. PCT/US2020/062508.

*Primary Examiner* — Eliza W Osenbaugh-Stewart
(74) *Attorney, Agent, or Firm* — Conley Rose, P.C.

(57) ABSTRACT

A nanoscale positioning system for positioning a positionable component includes a motion platform including a first end, a second end, a shuttle positioned between the first end and the second end and configured to support the positionable component, a flexure member, and a fluid passage extending through the flexure member from the first end to the second end of the motion platform, and a pressure controller coupled to the motion platform and fluidically connected to the fluid passage, wherein the pressure controller is configured to selectably provide a fluid pressure in the fluid passage to flex the flexure member whereby the shuttle is displaced along a motion axis of the motion platform.

12 Claims, 7 Drawing Sheets

(51) Int. Cl.
*F16M 11/18* (2006.01)
*F16M 11/22* (2006.01)
*G03F 7/00* (2006.01)
*H01J 37/20* (2006.01)
*H01J 37/26* (2006.01)

(52) U.S. Cl.
CPC ......... *G01Q 10/04* (2013.01); *G03F 7/70758* (2013.01); *H01J 37/26* (2013.01); *H01J 2237/20221* (2013.01)

(56) References Cited

U.S. PATENT DOCUMENTS

| | | |
|---|---|---|
| 2016/0052720 A1 | 2/2016 | Pawelski et al. |
| 2017/0191521 A1* | 7/2017 | Hopkins ............... G01J 3/0202 |

\* cited by examiner

NANOPOSITIONING SYSTEMS AND ASSOCIATED METHODS

CROSS-REFERENCE TO RELATED APPLICATIONS

This application is a 35 U.S.C. § 371 national stage application of PCT/US2020/062508 filed Nov. 27, 2020 and titled "Nanopositioning Systems and Associated Methods" which claims benefit of U.S. provisional patent application Ser. No. 62/941,339 filed Nov. 27, 2019, and entitled "Pressure-Fed Motion Mechanism," and U.S. provisional patent application Ser. No. 63/053,184 filed Jul. 17, 2020, and entitled "Fluid-Fed Cooling Method for Nanopositioning Stage," all of which are hereby incorporated herein by reference in their entirety.

STATEMENT REGARDING FEDERALLY SPONSORED RESEARCH OR DEVELOPMENT

Not applicable.

BACKGROUND

Precision devices may include components that must be positioned and/or manipulated with nanoscale accuracy and precision. Such precision devices may be utilized in a variety of fields including optical recording, robotic manipulation, semiconductor wafer manufacturing, mask correction, and scanning applications. For example, transmission electron microscopes (TEM) may include a specimen stage upon which a specimen holder including a specimen to be examined may be positioned. The specimen stage may be configured to perform microscopy using the TEM, the position of the specimen may be manipulated periodically via the specimen stage as desired by the user of the TEM. In some applications, the amplitude of the manipulation of the specimen desired by the user may be less than one micron (e.g., ten to hundreds of nanometers, for example). Thus, a positioning system for manipulating the position of the specimen stage may be required to have as great of accuracy as possible to provide as fine of control as possible over the positioning of the specimen. As another example, semiconductor manufacturing processes may utilize positioning stages manipulatable at nanoscale increments to allow for the inspection of nanoscale features of a wafer and/or for other purposes.

BRIEF SUMMARY OF THE DISCLOSURE

An embodiment of a nanoscale positioning system for positioning a positionable component includes a motion platform comprising a first end, a second end, a shuttle positioned between the first end and the second end and configured to support the positionable component, a flexure member, and a fluid passage extending through the flexure member from the first end to the second end of the motion platform, and a pressure controller coupled to the motion platform and fluidically connected to the fluid passage, wherein the pressure controller is configured to selectably provide a fluid pressure in the fluid passage to flex the flexure member whereby the shuttle is displaced along a motion axis of the motion platform. In some embodiments, the motion platform is monolithically formed from an additively manufactured material, and the fluid passage is defined by one or more inner surfaces of the motion platform. In some embodiments, the motion platform comprises a first fixed end coupled to a fixture, and a second fixed end coupled to the fixture, and the motion platform comprises a pair of the flexure members extending from the first fixed end to the second fixed end and a pair of the fluid passages, the pair of the flexure members being bilaterally symmetrical across the motion axis and the pair of the passages extending through the pair of the flexure members, and the shuttle is positioned between the pair of the flexure members. In certain embodiments, the positioning system comprises a fine actuator assembly comprising a fluid conduit coupled to the motion platform and which forms a closed fluid circuit with the fluid passage, and wherein the pressure controller is positioned along the fluid conduit is configured to provide a continuous flow of fluid along the fluid circuit. In certain embodiments, the positioning system comprises a coarse actuator assembly coupled to the motion platform and configured to displace the shuttle along the motion axis, wherein the coarse actuator assembly comprises maximum amplitude which is greater than a maximum amplitude of the fine actuator assembly. In some embodiments, the coarse actuator assembly comprises an electromechanical actuator configured to act against an end of the shuttle. In some embodiments, the positioning system comprises a system controller configured to operate both the coarse actuator assembly and the fine actuator assembly simultaneously. In certain embodiments, the pressure controller is configured to provide a fluid flow through the fluid passage to transport heat away from the motion platform.

An embodiment of a nanoscale positioning system for positioning a positionable component comprises a motion platform comprising a first end, a second end, and a shuttle positioned between the first end and the second end and configured to support the positionable component, and a coarse actuator assembly coupled to the motion platform and configured to displace the shuttle along a motion axis, wherein the coarse actuator assembly comprises a maximum amplitude, and a fine actuator assembly separate from the coarse actuator assembly and coupled to the motion platform, wherein the fine actuator assembly is configured to displace the shuttle along the motion axis comprises a maximum amplitude that is less than the maximum amplitude of the coarse actuator assembly. In some embodiments, the coarse actuator assembly comprises an electromechanical coarse actuator configured to act against an end of the shuttle, and a coarse actuator controller configured to provide the coarse actuator with an electrical stimulus to actuate the coarse actuator. In some embodiments, the coarse actuator assembly comprises a position sensor configured to determine a position of the shuttle and to provide feedback to the coarse actuator controller. In certain embodiments, the motion platform comprises a first fixed end coupled to a fixture, and a second fixed end coupled to the fixture, the motion platform comprises a pair of the flexure members extending from the first fixed end to the second fixed end and a pair of fluid passages, the pair of the flexure members being bilaterally symmetrical across the motion axis and the pair of the passages extending through the pair of the flexure members, and the shuttle and the coarse actuator are positioned between the pair of the flexure members, and wherein the fine actuator assembly comprises a fluid conduit in fluid communication with the pair of fluid passages. In some embodiments, the fine actuator assembly comprises a pressure controller coupled to the motion platform and fluidically connected to the pair of fluid passages, wherein the pressure controller is configured to selectably provide a fluid pressure in the pair of fluid passages to flex the pair of flexure members whereby the shuttle is displaced along the motion axis, and a pair of pressure sensors positioned at ends of the fluid conduit and each configured to provide feedback to the pressure controller. In some embodiments, the pressure controller is configured to provide a fluid flow through the pair of fluid passages to transport heat away from the motion platform. In certain embodiments, the positioning system comprises a system controller configured to operate both the coarse actuator assembly and the fine actuator assembly simultaneously. In certain embodiments, the coarse actuator assembly comprises a coarse positioning error with respect to the positionable component along the motion axis and the fine actuator assembly comprises a fine positioning error with respect to the positionable component along the motion axis, and wherein the fine positioning error is less than the coarse positioning error.

An embodiment of a method for positioning a positionable component comprises (a) determining a desired displacement of the positionable component from an initial position along a motion axis of a motion platform, the positionable component being supported on a shuttle of the motion platform, and (b) operating a pressure controller coupled to the motion platform to selectably provide a fluid pressure in a fluid passage formed in the motion platform to flex a flexure member of the motion platform and displace the positionable component along the motion axis in response to determining the desired displacement of the positionable component, wherein the displacement provided by the flexure member to the positionable component is less than 1 millimeter (mm). In some embodiments, the motion platform is monolithically formed and additively manufactured. In some embodiments, the method comprises (c) operating an electromechanical linear actuator to act against an end of the shuttle and displace the shuttle along the motion axis. In some embodiments, the pressure controller is operated simultaneously with the linear actuator to correct a positioning error introduced by the linear actuator.

BRIEF DESCRIPTION OF THE DRAWINGS

For a detailed description of exemplary embodiments of the disclosure, reference will now be made to the accompanying drawings in which.

DETAILED DESCRIPTION OF THE DISCLOSED EMBODIMENTS

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis. As used herein, the terms "approximately," "about," "substantially," and the like mean within 10% (i.e., plus or minus 10%) of the recited value. Thus, for example, a recited angle of "about 80 degrees" refers to an angle ranging from 72 degrees to 88 degrees.

As described above, precision devices may include positioning systems configured to achieve high positioning accuracy and precision at high speeds. Precision devices may comprise a dual-stage positioning assembly comprising a coarse positioning stage or platform and a fine positioning stage or platform. The coarse positioning platform may provide coarse positioning control of a positionable component (e.g., a sample to be analyzed, a workpiece, a component of the precision device, etc.) along a first or coarse motion axis, while the fine positioning platform may provide fine positioning control of the positionable component along a second or fine motion axis which is typically offset from the coarse motion axis.

The course positioning platform may be driven by an electromechanical actuator such as a leadscrew or a ball screw while the fine positioning platform may be driven by an electromechanical actuator having a relatively greater level of accuracy and precision such as a piezoelectric (PZT) actuator, a voice coil motor, or a micro-electric-mechanical system (MEMS) actuator. The fine positioning platform may correct a positioning error produced by the relatively less accurate and precise coarse positioning platform, which may in-turn offer a greater amplitude of movement than that providable by the fine positioning platform. However, the offset between the coarse motion axis and the fine motion axis may introduce additional positioning error of the positionable component that may be difficult to correct or eliminate. For instance, the fine positioning platform in conventional positioning systems is typically placed on top of the coarse positioning platform, resulting in an offset along a vertically extending axis which may result in Abbe error. The offset between the coarse motion axis and the fine motion axis may also introduce additional difficulties in synchronizing the actuation of the coarse and fine positioning platforms. Further, the electromechanical actuators used to drive the positioning system, such as the leadscrew and ball screw actuators used to drive coarse positioning platforms, may generate a relatively great amount of heat that may introduce thermal instability between the coarse and fine motion axes.

Accordingly, embodiments disclosed herein comprise nanoscale positioning systems that may include an integrally or monolithically formed motion stage or platform comprising a first or coarse actuator assembly configured to displace a translatable section or shuttle of motion platform along a first or coarse motion axis and a second or fine actuator assembly configured to displace the shuttle along a second or fine motion axis that is coaxial with the coarse motion axis, thereby eliminating the offset between the coarse and fine motion axes. The coarse actuator assembly of the positioning system may be configured to provide coarse motion control along the coarse motion with a maximum amplitude or range of approximately 1 meter or less. The fine actuator assembly of the positioning system may be configured to provide fine motion control along the fine motion axis with a maximum amplitude of approximately less than 1 millimeter (mm). Thus, the maximum range or amplitude of coarse actuator assembly 200 may be greater than the maximum range or amplitude of fine actuator assembly 250.

Embodiments of nanoscale positioning systems disclosed herein may include a coarse actuator assembly comprising a PZT actuator for providing the coarse motion control and a fine actuator assembly that comprises a fluid actuator assembly driven by fluid pressure and/or flowrate. The coarse actuator assembly may act directly against a surface of the monolithic motion platform to provide coarse motion control of the shuttle of the platform along the coarse motion axis. The fluid actuator assembly may comprise a pneumatic and/or a hydraulic pressure-driven motion mechanism configured to provide fine motion control via altering a fluid pressure or a fluid flowrate provided by the fluid actuator assembly. The fluid actuator assembly may be integrated into a monolithic motion platform via one or more fluid passages which extend through the platform and which receives the fluid from the fluid actuator assembly. Rather than acting against a piston in an air bearing cylinder-type mechanism, the fluid provided by the fluid actuator assembly may act directly against an inner wall of the fluid passage of the motion platform to provide fine motion control of the shuttle of the platform along the fine motion axis (concentric with the coarse motion axis).

Along with allowing for coarse and fine motion control along a single motion axis (the coarse and fine motion axes being coaxially aligned), the fluid actuator assembly of embodiments of nanoscale positioning systems disclosed herein may provide thermal stability to the positioning system by using convection to transport heat away from the monolithic motion platform. For example, the coarse actuator assembly may generate heat which is conducted to the monolithic motion platform. Fluid flowing through the one or more channels formed in the monolithic motion platform and along a fluid channel or circuit extending away from the platform may transport the heat away from the platform, thereby providing the platform with thermal stability. By stabilizing the temperature of the monolithic motion platform, the accuracy of the positioning system may be increased as thermal instability may increase a positioning error of the coarse and/or fine actuator assemblies due to, for example, altering the dimensions and other properties of the motion platform.

Figure 1:
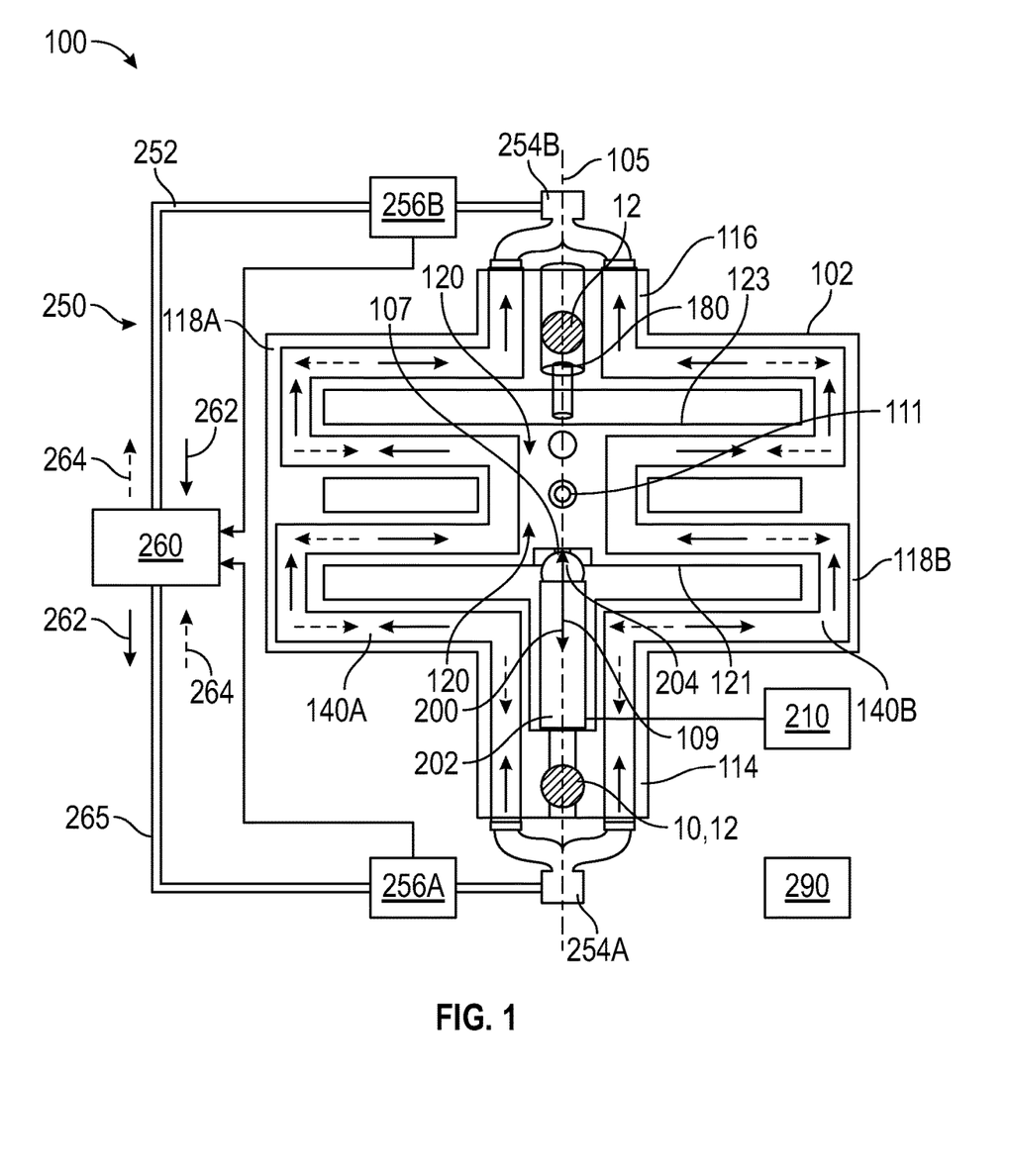
FIG. 1 is a schematic view of a nanoscale positioning system according to some embodiments.
Figure 2:
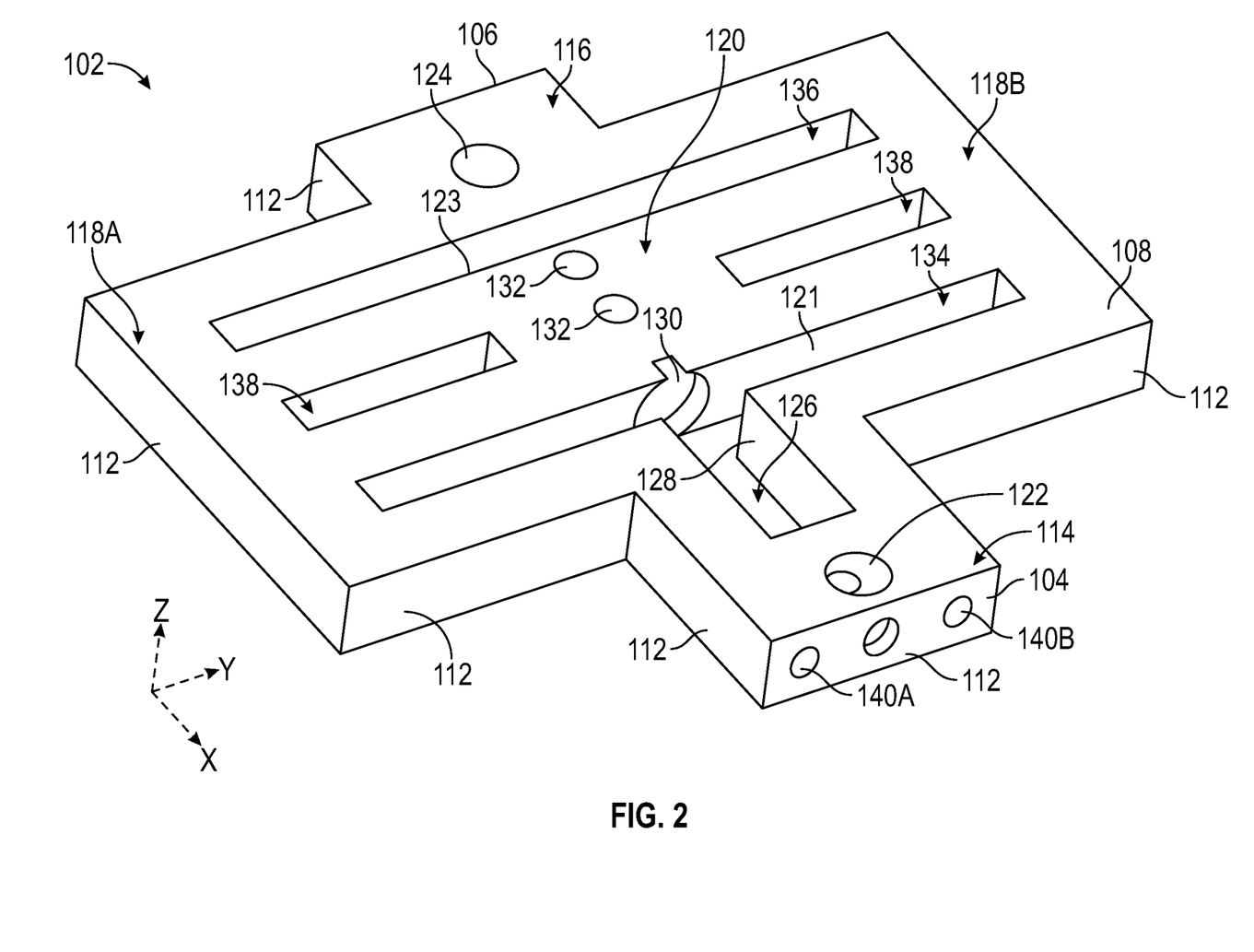
FIG. 2 is a perspective view of motion platform according to some embodiments.
Figure 3:
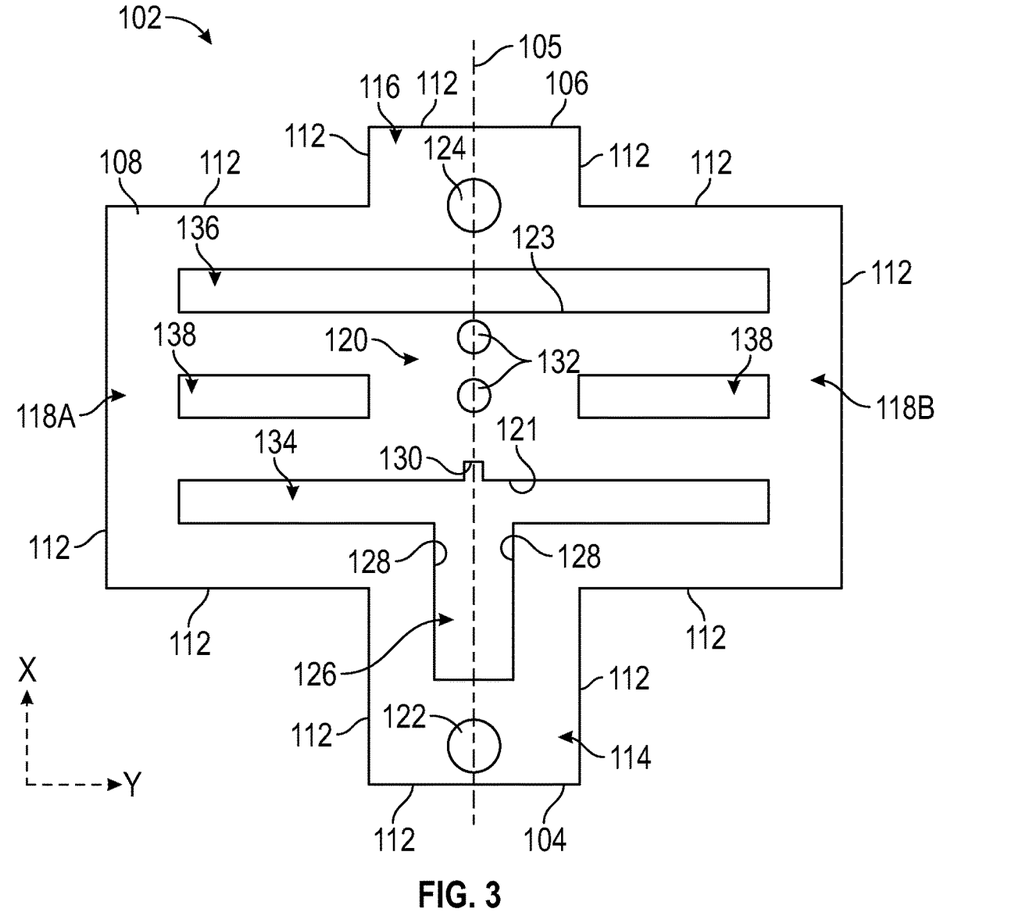
FIG. 3 is a top view of the motion platform of FIG. 2.
Figure 4:
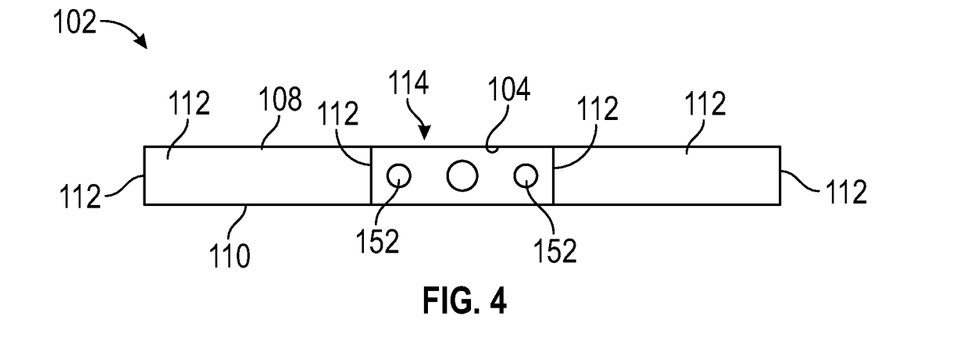
FIG. 4 is a front view of the motion platform of FIG. 2.
Figure 5:
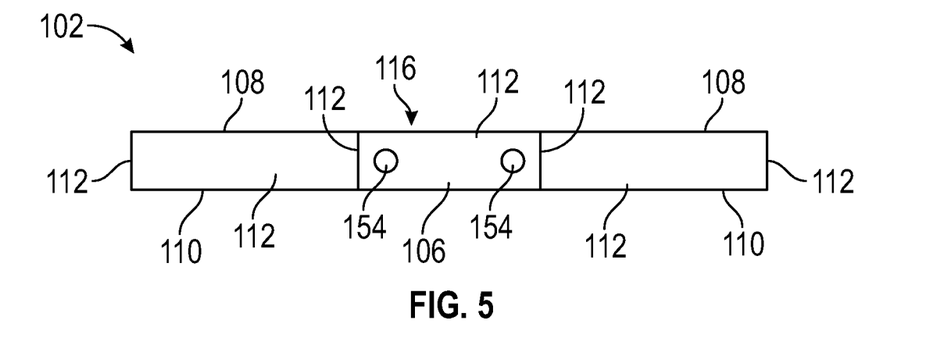
FIG. 5 is a rear view of the motion platform of FIG. 2.
Figure 6:
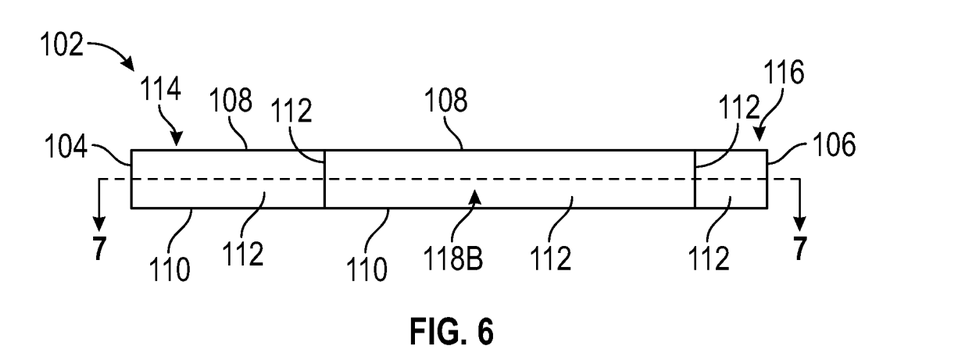
FIG. 6 is a side view of the motion platform of FIG. 2.

Referring initially to FIG. 1, an embodiment of a nanoscale positioning system 100 is shown. Positioning system 100 may comprise a component of a precision device 10 (only partially shown in FIG. 1). The precision device 10 may comprise a manufacturing device, a scanning device, an optical device, or any other device requiring nanoscale accuracy in positioning and/or manipulating a positionable component (e.g., a sample, a workpiece, etc.) of precision device 10. For example, precision device 10 may comprise an electron microscope, such as a TEM, and positioning system 100 may be configured to position and manipulate a sample to be analyzed with nanoscale precision.

Positioning system 100 generally includes an integrally or monolithically formed motion stage or platform 102, a coarse actuator assembly 200, a fine actuator assembly 250, a position sensor 180, and a system controller 290. Coarse actuator assembly 200 is configured to manipulate a position of a translatable section or shuttle 120 of platform 102 along a coarse motion axis 105. Fine actuator assembly 250 is configured to manipulate a position of shuttle 120 along a fine motion axis that is concentric and coaxially aligned with coarse motion axis 105. Given that the coarse and fine motion axes are coaxial in this embodiment, coarse motion axis 105 may also be referred to herein as a single or shared motion axis 105 of positioning system 100.

Coarse actuator assembly 200 is configured to provide coarse motion control along the motion axis 105 with a maximum amplitude or range of approximately 1 meter or less. Fine actuator assembly 250 is configured to provide fine motion control along motion axis 105 with a maximum amplitude or range of approximately less than 1 mm. In some embodiments, the maximum amplitude of fine actuator assembly 250 may be 200 nanometers (nm) or less. Thus, the maximum amplitude of coarse actuator assembly 200 may be greater than the maximum amplitude of fine actuator assembly 250. In some embodiments, the maximum amplitude of coarse actuator assembly 200 may be one or more orders of magnitude greater than the maximum amplitude of fine actuator assembly 250. Additionally, the fine actuator assembly 250 may also be used to actively adjust dynamic properties of the motion platform 102, such as the stiffness, damping coefficient, natural frequency, etc., of the platform 102. As will be discussed further herein, system controller 290 is generally configured to control the operation of both coarse actuator assembly 200 and fine actuator assembly 250 to achieve a position or linear displacement of shuttle 120 desired by a user of precision device 10.

Referring now to FIGS. 2-8, views of the monolithic motion platform 102 of positioning system 100 are shown. In some embodiments, motion platform 102 may be additively manufactured (e.g., via a three-dimensional, layer-by-layer printing process, etc.) from a metal powder material, such as a stainless-steel (SS) material. In other embodiments, motion platform 102 may comprise a bulk material (e.g., a bulk metal material such as bulk SS) that is fabricated (e.g., electric discharge machining, waterjet machining, micro milling, etc.) to form motion platform 102. In still other embodiments, motion platform 102 may be formed using a semiconductor lithography process. Unlike at least some machining techniques (e.g., computer numerical control (CNC) machining, etc.) and MEMS processes, additive manufacturing of motion platform 102 allows for the creation of internal structures within motion platform 102 (e.g., fluid passages 140A, 140B discussed below). Additionally, additively manufacturing motion platform 102 may minimize the amount of material required for producing platform 102 (e.g., via minimizing the amount of wasted materials), thereby minimizing the cost for manufacturing motion platform 102 relative to other manufacturing techniques.

Motion platform 102 has a central or longitudinal axis coaxially aligned with motion axis 105 and generally includes a longitudinal first end 104, a longitudinal second end 106 opposite first end 104, an external upper surface 108, an external lower surface 110 opposite upper surface 108, and a plurality of external side surfaces 112. Each external side surface 112 extends between the upper surface 108 and lower surface 110. Surfaces 108, 110, and 112 are each planar in this embodiment; however, in other embodiments, the geometry of surfaces 108, 110, and 112 may vary.

Motion platform 102 includes several different distinct portions or sections monolithically formed with one another. Particularly, motion platform 102 includes a first fixed section or end 114 positioned at the first end 104 of platform 102, a second fixed section or end 116 positioned at the second 106 of platform 102, a pair of flexure sections or members 118A, 118B having bilateral symmetry with respect to the central axis of motion platform 102, and the shuttle 120 positioned between both the fixed ends 114, 116 and flexure members 118A, 118B along the central axis of motion platform 102.

A pair of fixture apertures 122, 124 are positioned at fixed ends 114, 116 respectively, each fixture aperture 122, 124 extending entirely between the upper surface 108 and lower surface 110 of motion platform 102. Each of the fixture apertures 122, 124 receives part of a fixture 12 of the precision device 10 to secure the motion platform 102 to precision device 10. For example, each fixture aperture 122, 124 receives a separate fastener of the fixture 12 to releasably couple motion platform 102 to the fixture 12. In this configuration, relative movement between each fixed end 114, 116 of motion platform 102 and the fixture 102 along three orthogonally extending axes (e.g., the "X," "Y," and "Z" axes shown in FIG. 2) is restricted. In other embodiments, the fixed ends 114, 116 may be secured to the fixture 12 of precision device 10 in a variety of ways, and thus motion platform 102 need not include fixture apertures 122, 124 for securing fixed ends 114, 116 to fixture 12.

Motion platform 102 also includes a longitudinally extending coarse actuator receptacle 126 defined by a plurality of interior side surfaces 128. Coarse actuator receptacle 126 extends along motion axis 105 and may be formed in the first fixed end 114 of motion platform 102. Coarse actuator receptacle 126 is configured to receive at least a portion of the coarse actuator assembly 200. Additionally, the shuttle 120 of motion platform 102 includes a first longitudinal end 121, a second longitudinal end 123 opposite first longitudinal end 121, and a coarse actuator opening 130 facing the coarse actuator receptacle 126 and aligned with motion axis 105. As will be discussed in more detail below, coarse actuator opening 130 of shuttle 120 is also be configured to receive at least a portion of the coarse actuator assembly 200. Shuttle 120 also includes one or more positionable component receptacles 132 extending entirely between the upper surface 108 and lower surface 110 of motion platform 102. Each positionable component receptacle 132 receives a portion of the positionable component (not shown in FIGS. 2-8) of the precision device 10 to be positioned and/or manipulated by positioning system 100.

The shuttle 120 of motion platform 102 is separated from the first fixed end 114 thereof by a first outer lateral opening 134 formed in platform 102 and extending entirely between upper surface 108 and lower surface 110. Similarly, shuttle 120 is separated from the second fixed end 116 of motion platform 102 by a second outer lateral opening 136 formed in platform 102 and extending entirely between upper surface 108 and lower surface 110. Additionally, each flexure member 118A, 118B includes an inner lateral opening 138 extending entirely between upper surface 108 and lower surface 110. Inner lateral openings 138 have bilateral symmetry about motion axis 105 and are each positioned between one of the flexure members 118A, 118B and the shuttle 120 of motion platform 102.

Flexure members 118A, 118B connect shuttle 120 to the fixed ends 114, 116 of motion platform 102 in a manner that permits shuttle 120 to translate along motion axis 105 (e.g., in the "X" direction shown in FIGS. 2, 3, and 7) relative to fixed ends 114, 116 and the fixture 12 of precision device 10. Flexure members 118A, 118B are used to control the position and/or motion of shuttle 120 through the actuation of fine actuator assembly 250. Fine actuator assembly 250 may be integrated with motion platform 102 via a pair of fluid passages or channels 140A, 140B which extend through the flexure members 118A, 118B, respectively. As shown particularly in FIGS. 7, 8, each fluid passage 140A, 140B each extend in a serpentine manner and comprise a plurality of lateral sections 142 (extending in the "Y" direction shown in FIG. 7) and a plurality of longitudinal sections 144 (extending in the "X" direction shown in FIG. 7) joined to the lateral sections 142 by bends 146. Bends 146 of each fluid passage 140A, 140B may comprise ninety-degree bends.

Figure 7:
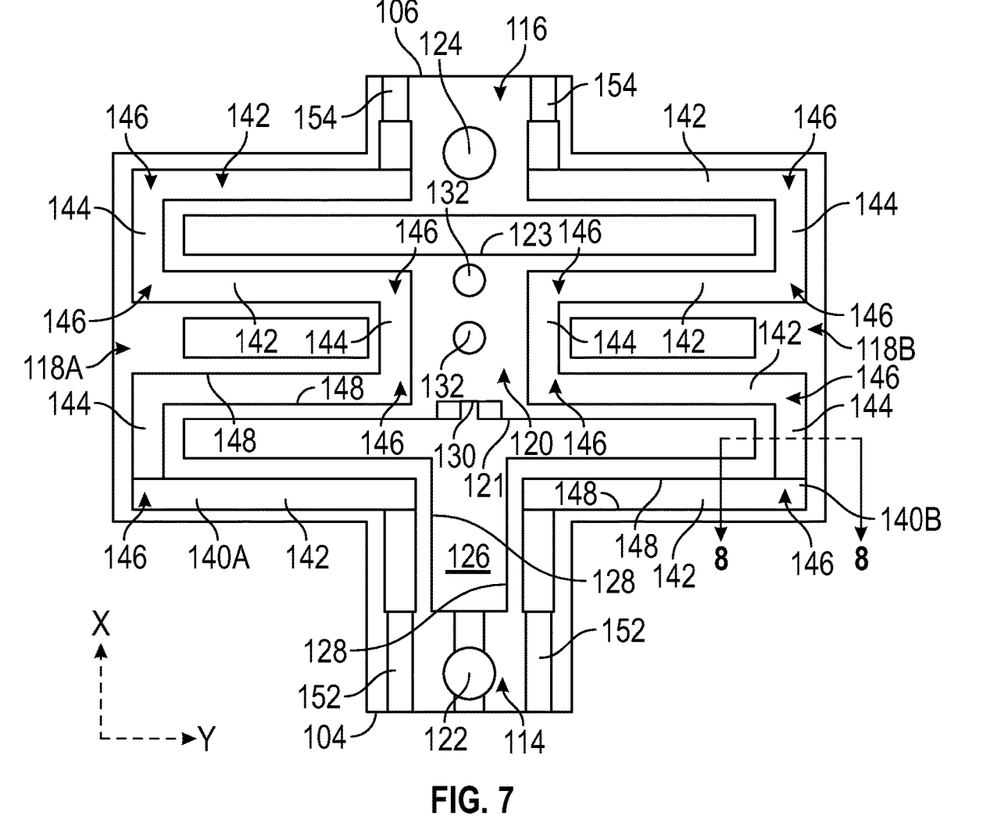
FIG. 7 is a cross-sectional view along lines 7-7 of FIG. 6 of the motion platform of FIG. 2.
Figure 8:
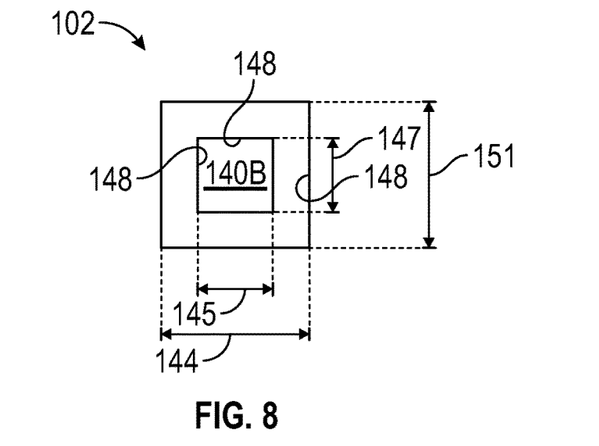
FIG. 8 is a cross-sectional view along lines 8-8 of FIG. 7 of the motion platform of FIG. 2.

In this embodiment, each fluid passage 140A, 140B has a rectangular cross-section and is defined by a plurality of inner surfaces 148; however, in other embodiments, the cross-section of each fluid passage 140A, 140B may vary in configuration. Inner surfaces 148 each are generally planar and extend at ninety-degree angles from each other. Each fluid passage 140A, 140B has an inner width 145 and an inner height 147 equal in size and approximately between 2.0 mm and 3.0 mm. Additionally, each flexure member 118A, 118B has an outer width 149 and an outer height 151 that are equal to each other and may be approximately between 4.0 mm and 6.0 mm. However, the outer width 149 and outer height 151 of each flexure member 118A, 118B may vary along its length and portions of each flexure member 118A, 118B may have an outer width 149 and an outer height 151 that are unequal.

Each fluid passage 140A, 140B is fluidically coupled to a pair of first ports 152 formed in the first fixed end 114 and extending from an end of each fluid passage 140A, 140B to the first end 104 of motion platform 102. Similarly, each fluid passage 140A, 140B is fluidically coupled to a pair of second ports 152 formed in the second fixed end 116 and extending from an end of each fluid passage 140A, 140B to the second end 106 of motion platform 102. In this embodiment, each port 152, 154 of motion platform 102 is generally cylindrical in cross-section; however, in other embodiments, the cross-section of ports 152, 154 may vary in geometry and/or configuration.

Referring again to FIG. 1, position sensor 180 of positioning system 100 is generally configured to determine a position of the shuttle 120 of motion platform 102. Particularly, position sensor 180 determines and monitors a position of shuttle 120 along the motion axis 105. Position sensor 180 is configured to output an electrical signal that corresponds to a position of the shuttle 120 along the motion axis 105. Position sensor 180 is positioned in a receptacle (hidden in FIGS. 2-8) formed in the second fixed end 116 of motion platform 102 such that relative movement is restricted between position sensor 180 and second fixed end 116. Additionally, position sensor 180 is positioned along the motion axis 105. Position sensor 180 includes a tip or terminal end 182 positioned adjacent the second longitudinal end 123 of shuttle 120. Position sensor 180 determines and monitors a proximity between the tip 182 of sensor 180 and the second longitudinal end 123 of shuttle 120.

In some embodiments, position sensor 180 includes a capacitive linear position sensor; however, in other embodiments, the configuration of position sensor 180 may vary. Additionally, while only a single position sensor 180 is shown in FIG. 1, in other embodiments, positioning system 100 may include a plurality of position sensors (e.g., position sensors similar in configuration to position sensor 180) configured to determine and monitor a position of shuttle 120 along the motion axis 105. Additionally, at least some of the position sensors may be offset from motion axis 105 and may be configured to determine and monitor a yaw of shuttle 120 about the vertical axis 111 in either angular direction. As will be discussed in more detail below, feedback provided by position sensor 180 is used in controlling the operation of coarse actuator assembly 200 and/or fine actuator assembly 250.

Referring again to FIG. 1, as described above, coarse actuator assembly 200 is configured to provide coarse motion control (e.g., provide motion having a maximum amplitude of approximately 1.5 μm) of shuttle 120 of platform 102 along motion axis 105. Coarse actuator assembly 200 generally includes an electromechanical coarse actuator 202 and a coarse actuator controller 210. Coarse actuator 202 is positioned within coarse actuator receptacle 126 of motion platform 102 and extends generally along motion axis 105. Coarse actuator 202 is coupled to platform 102 or fixture 12 of precision device 10. Coarse actuator 202 includes a linear actuator including a terminal end 204 received in the coarse actuator opening 130 of motion platform 102.

In this embodiment, coarse actuator 202 includes a PZT actuator or transducer actuatable in response to receiving an electrical signal or stimulus from coarse actuator controller 210; however, in other embodiments, the configuration of coarse actuator 202 may vary. For example, coarse actuator 202 may alternatively comprise a voice coil-based actuator, a MEMS-based actuator, etc. In some embodiments, coarse actuator 202 may have dimensions of approximately 5 mm in width, 5 mm in height, and 10 mm in length; however, in other embodiments, the dimensions of coarse actuator 202 may vary.

In response to receiving stimuli from coarse actuator controller 210, the terminal end 204 of coarse actuator 202 extends in a first direction 107 along motion axis 105 or retract in a second direction 109, opposite first direction 107, along motion axis 105. By extending the terminal end 204 of coarse actuator 202 in the first direction 107, coarse actuator 202 applies a force against the first longitudinal end 121 of shuttle 120 at the coarse actuator opening 130 thereof. By applying a force from the coarse actuator 202 against the first longitudinal end 121 of shuttle 120, coarse actuator 202 displaces shuttle 120 in the first direction 107 along motion axis 105. Conversely, by retracting the terminal end 204 of coarse actuator 202 in the second direction 109, a force applied by coarse actuator 202 against shuttle 120 is reduced or eliminated. In some embodiments, the terminal end 204 of coarse actuator 202 may be secured to the first longitudinal end 121 of shuttle 120 such that retraction of terminal end 204 may displace shuttle 120 in the second direction 109 along motion axis 105.

Through manufacturing tolerances or some other assembly or manufacturing error, coarse actuator 202 may extend at a non-zero, acute angle relative to motion axis 105, and thus, the force applied by coarse actuator 202 against the first longitudinal end 121 of shuttle 120 may not be solely in the first direction 107 along motion axis 105. In this scenario, coarse actuator 202 may, in addition to the longitudinal force along motion axis 105, apply a rotational force about a vertical axis 111 to the shuttle 120, causing shuttle 120 to potentially yaw about the vertical axis 111. As will be described in more detail below, fine actuator assembly 250 may be operated to eliminate or at least mitigate any yawing of shuttle 120 about vertical axis 111 resulting from the actuation of coarse actuator 202.

Coarse actuator controller 210 is in signal communication (e.g., via one or more cables or wires extending therebetween and/or via one or more wireless transceivers) and generally configured to control the operation of coarse actuator 202. Course actuator controller 210 is an electronic component including a processor, a memory, and an input/output (I/O) unit. Course actuator controller 210 may interface with the system controller 290 of positioning system 100, and in some embodiments system controller 290 may control coarse actuator 202 through the coarse actuator controller 210. Coarse actuator controller 210 receives feedback from position sensor 180 in the form of the position of shuttle 120 along motion axis 105 as determined by position sensor 180. Coarse actuator controller 210 controls coarse actuator 202 in response to feedback received from position sensor 180 and/or signals received by coarse actuator controller 210 from system controller 290, as will be discussed in more detail below.

Still referring to FIG. 1, as described above, fine actuator assembly 250 is configured to provide fine motion control over shuttle 120 along motion axis 105. Fine actuator assembly 250 generally includes a fluid line or conduit 252, a first fluid manifold 254A, a second fluid manifold 254B opposite first fluid manifold 254A, a first pressure sensor 256A, a second pressure sensor 256B, and a pressure controller 260. Additionally, given that fluid passages 140A, 140B of motion platform 102 is in fluid communication with fluid conduit 252, fluid passages 140A, 140B may be referred to herein as comprising part of the fine actuator assembly 250.

Fluid conduit 252 includes a single fluid conduit in fluid communication with the pair of fluid passages 140A, 140B of motion platform 102. Particularly, first fluid manifold 254A extends between an end of the fluid conduit 252 and the pair of first ports 152 of the first fixed end 114 of motion platform 102 while second fluid manifold 254B extends between an opposite end of the fluid conduit 252 and the pair of second ports 154 of the second fixed end 116 of motion platform 102. Fluid conduit 252 extends between fluid manifolds 254A, 254B and forms a closed fluid loop or circuit 265 with fluid passages 140A, 140B of motion platform 102.

Fluid manifolds 254A, 254B may divide or combine flows of fluid depending on a direction of the fluid flow. For example, fluid may flow through fine actuator assembly 250 in a first direction (indicated by solid arrows 262 in FIG. 1) through fluid conduit 252, enter first fluid manifold 254A where the fluid is divided between fluid passages 140A, 140B as the fluid flows therethrough, and is recombined in second fluid manifold 254B as the fluid enters the opposite end of fluid channel 252. Conversely, fluid may flow through fine actuator assembly 250 in a second direction (indicated by dashed arrows 264 in FIG. 1), opposite first direction 262, through fluid conduit 252, enter second fluid manifold 254B where the fluid is divided between fluid passages 140A, 140B as the fluid flows therethrough, and is recombined in first fluid manifold 254A as the fluid enters the opposite end of fluid channel 252.

Pressure controller 260 of fine actuator assembly 250 includes a bidirectional proportional pressure controller (BPPC) configured to control properties of the fluid within fluid circuit 265. For example, pressure controller 260 may control a fluid pressure of fluid circuit 265, a flowrate of fluid circuit 265, a direction of flow (e.g., either the first direction 262 or the second direction 264) of fluid circuit 265, or combinations thereof. In some embodiments, pressure controller 260 includes a pneumatic or hydraulic pressure regular or control device configured to provide bidirectional fluid flow and pressure control. Fluid circuit 265 of fine actuator assembly 250 may include various types of fluids including compressible fluids or gasses and incompressible fluids or liquids. For example, fluid circuit 265 may comprise gasses like air or liquids like water or oil.

By varying pressure, flowrate, and/or flow direction of the fluid in fluid circuit 265 via pressure controller 260, the dynamic properties (e.g., stiffness, damping coefficient, natural frequency, etc.) of the flexure members 118A, 118B through which fluid passages 140A, 140B can be selectively tuned. Additionally, flexure members 118A, 118B displaces the shuttle 120 coupled therewith along motion axis 105 in response to varying pressure, flowrate, and flow direction of the fluid in fluid circuit 265 via pressure controller 260. Particularly, varying pressure, flowrate, flow direction, or combinations thereof of fluid in fluid circuit 265 may vary fluid pressure forces applied to the inner surfaces 148 of fluid passages 140A, 140B, thereby varying fluid pressure forces applied to flexure members 118A, 118B causing the flexure members 118A, 118B to flex. The flexing of flexure members 118A, 118B is communicated to shuttle 120 in the form of motion of shuttle 120 along motion axis 105. Thus, by varying pressure, flowrate, flow direction, or combinations thereof of fluid in fluid circuit 265, shuttle 120 can be selectably positioned along motion axis 105 with fine motion control (e.g., provide motion having a maximum amplitude of approximately 200 nm).

The flexing of flexure members 118A, 118B and concomitant displacement of shuttle 120 in either the first direction 107 or second direction 109 may result from a pressure differential in the fluid disposed in fluid manifolds 254A, 254B. Particularly, the pressure of fluid flowing along fluid circuit 265 may be reduced as the fluid passes through fluid passages 140A, 140B. For example, if the fluid in fluid circuit 265 is flowing in the first direction 262, then fluid pressure in first fluid manifold 254A may be greater than in second fluid manifold 254B, with the resulting pressure differential therebetween resulting in a net pressure force being applied to shuttle 120 in the first direction 107. Conversely, if the fluid in fluid circuit 265 is flowing in the second direction 264, then fluid pressure in second fluid manifold 254B may be greater than in first fluid manifold 254A, with the resulting pressure differential therebetween resulting in a net pressure force being applied to shuttle 120 in the second direction 109. Thus, the direction of travel of shuttle 120 along motion axis 105 (e.g., first direction 107 or second direction 109) may be controlled by the direction of fluid flow (e.g., first direction 262 or second direction 264) through fluid circuit 265.

Additionally, instead of displacing a piston or other slidable member in response to varying properties of the fluid in fluid circuit 265, fine actuator assembly 250 is configured to selectably and controllably flex motion platform 102 itself via pneumatic or hydraulic actuation whereby shuttle 120 may be positioned or translated along motion axis 105. By incorporating the fine actuator assembly 250 directly into motion platform 102 via fluid passages 140A, 140B fine motion control and coarse motion control may be provided for the shuttle 120 along a coaxially aligned or singular motion axis 105. Additionally, by incorporating the fine actuator assembly 250 into motion platform 102 a single monolithically formed platform (e.g., motion platform 102) may be utilize to provide both coarse and fine motion control, eliminating the need to include a fastener or other joint between separate platforms configured to separately provide coarse and fine motion control. Positioning error may be minimized by providing for both coarse and fine motion control utilizing a single monolithically formed motion platform.

Sensors 256A, 256B determine and monitor fluid pressure entering and exiting the fluid manifolds 254A, 254B, respectively, of fine actuator assembly 250. Particularly, a first pressure sensor 256A determines and monitors a pressure of fluid entering or exiting first fluid manifold 256A and is positioned proximal first fluid manifold 254A. Conversely, a second pressure sensor 256B determines and monitors a pressure of fluid entering or exiting second fluid manifold 256B and is positioned proximal second fluid manifold 254B. Each of pressure sensors 256A, 256B outputs an electrical signal corresponding to the fluid pressure determined by respective pressure sensor 256A, 256B.

Pressure controller 260 of fine actuator assembly 250 is an electronic component including a processor, a memory, and an I/O unit. Pressure controller 260 may interface with the system controller 290 of positioning system 100, and in some embodiments system controller 290 may control fine actuator assembly 250 through the pressure controller 260. Pressure controller 260 receives feedback from pressure sensors 256A, 256B corresponding to the pressure entering or exiting the fluid manifolds 254A, 254B, respectively, as determined by pressure sensors 256A, 256B. In some embodiments, pressure controller 210 receives feedback from position sensor 180. In certain embodiments, pressure controller 260 estimates a displacement of shuttle 120 along motion axis 105 caused by fine actuator assembly 250 based on the feedback provided by pressure sensors 256A, 256B, the type of fluid within fluid circuit 265, properties of the motion platform 102 (e.g., the geometry of motion platform 102, material properties of the material comprising motion platform 102, etc.), or combinations thereof. Pressure controller 260 controls coarse actuator 202 in response to feedback received from pressure sensors 256A, 256B and/or signals received by pressure controller 260 from system controller 290.

Figure 9:
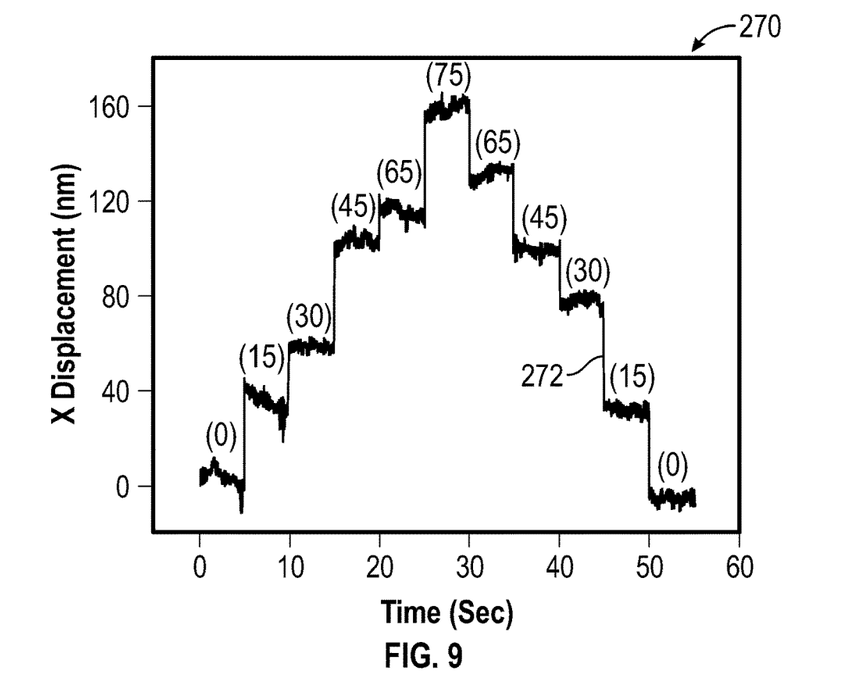
FIG. 9 is a graph illustrating exemplary displacement data pertaining to the positioning system of FIG. 1 according to some embodiments.

Referring briefly to FIG. 9, a graph 270 illustrates an exemplary displacement 172 of the shuttle 120 by fine actuator assembly 250 in the first direction 107 along motion axis 105 (shown in nm along the Y-axis of graph 270) over a period of time (shown in seconds (sec) along the X-axis of graph 270) and as measured by position sensor 180. In this example, the numbers in parenthesis (e.g., "(15)" positioned above the displacement 172 between 5 and 10 seconds) indicates the pressure in pounds per square inch (PSI) of fluid (air in this example) within fluid passages 140A, 140B of motion platform 102. Thus, in this example, a displacement of approximately 30 nm to 40 nm in shuttle 120 may be achieved from an initial position of 0 nm along motion axis 105 in response to increasing air pressure within fluid passages 140A, 140B from ambient (e.g., 0 PSI) to approximately 15 PSI. Similarly, in this example, a maximum displacement or amplitude of approximately 160 nm may be achieved by increasing air pressure within fluid passages 140A, 140B to approximately 75 PSI. In this example, pressure controller 260 achieves the various pressures shown in graph 270 using an open loop control scheme. In other embodiments, the performance of fine actuator assembly 250 may vary from that shown in graph 270.

In addition to providing nanoscale motion control, fine actuator assembly 250 can also regulate the temperature of motion platform 102 so as to provide thermal stability to positioning system 100. For example, referring to FIG. 10, a graph 280 is shown illustrating temperatures (shown in degrees Celsius (° C.) along the Y-axis of graph 280) 281, 282, 283, 284, 285, 286, and 287 of shuttle 120 for various configurations of fine actuator assembly 250 over time (time shown in minutes (min) along the X-axis of graph 280) and in response to the application of a cartridge heater (providing approximately 40 watts of energy in this example) to the shuttle 120 at a start time (T=0 min in graph 280). The cartridge heater may simulate heat generated by the coarse actuator 202 or by heat generating components of the precision device 10 in proximity with positioning system 100.

Figure 10:
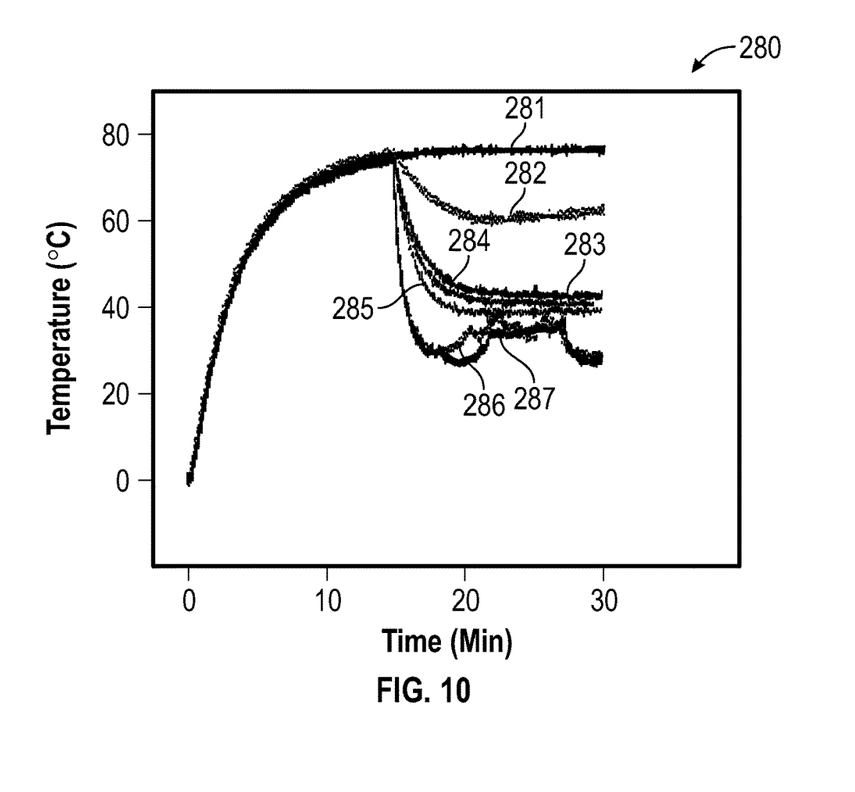
FIG. 10 is a graph illustrating exemplary temperature data pertaining to the positioning system of FIG. 1 according to some embodiments.

Particularly, temperature 282 corresponds to a configuration of fine actuator assembly 250 in which pressure controller 260 supplies fluid passages 140A, 140B with approximately 80 PSI of pressurized air beginning at an actuation time (T=approximately 15 min in graph 280). Temperature 283 corresponds to a configuration of fine actuator assembly 250 in which pressure controller 260 supplied fluid passages 140A, 140B with approximately 20 PSI of pressurized air at the actuation time. Temperature 284 corresponds to a configuration of fine actuator assembly 250 in which pressure controller 260 supplied fluid passages 140A, 140B with approximately 10 PSI of pressurized air at the actuation time. Temperature 285 corresponds to a configuration of fine actuator assembly 250 in which pressure controller 260 supplied fluid passages 140A, 140B with approximately 50 PSI of pressurized air at the actuation time. Temperature 286 corresponds to a configuration of fine actuator assembly 250 in which pressure controller 260 supplied fluid passages 140A, 140B with water flowing at approximately 110 millimeters per second (mm/s) at the actuation time. Temperature 287 corresponds to a configuration of fine actuator assembly 250 in which pressure controller 260 supplied fluid passages 140A, 140B with water flowing at approximately 530 millimeters per second (mm/s) at the actuation time. Finally, temperature 281 corresponds to a configuration of fine actuator assembly 250 in which assembly 250 remains dormant and unactuated during the entire time period. Thus, graph illustrates that heat transfer between shuttle 120 and the fluids (air or water) disposed within fluid passages 140A, 140B results in a substantial reduction in the temperature of the shuttle 120 following the actuation time at approximately 15 minutes in this example. By reducing and stabilizing the temperature of shuttle 120 and motion platform 102 generally, error resulting from alterations of properties of motion platform 102 (e.g., changes in stiffness, changes in geometry, etc.) resulting from temperature variation of motion platform 102 may be minimized by the heat transfer provided by fine actuator assembly 250 which may be convective in nature.

Referring again to FIG. 1, system controller 290 of positioning system 100 is generally configured to control the operation of both coarse actuator assembly 200 and fine actuator assembly 250. System controller 290 is an electronic component including a processor, a memory, and an IO unit, and is in signal communication (e.g., via one or more cables or wires extending therebetween and/or via one or more wireless transceivers) with both coarse actuator controller 210 and pressure controller 260 to control the operation thereof. In some embodiments, system controller 290 includes a closed-loop proportional-integral (PI) controller; however, in other embodiments, the configuration of system controller 290 may vary.

For example, a user of precision device 10 and/or a controller of device 10 may communicate a requested position or a requested trajectory (e.g., a periodic trajectory having a prescribed amplitude, frequency, wave-shape, etc.) of the positionable component (supported on shuttle 120 of motion platform 102) to system controller 290 of positioning system 100. Based on the requested position or trajectory and a first or initial position of shuttle 120 (where both actuator assemblies 200, 250 are dormant) of motion platform 100, system controller 100 may actuate coarse actuator assembly 200, fine actuator assembly 250, or both coarse actuator assembly 200 and fine actuator assembly 250 concurrently as part of a dual-mode control regime.

For example, if the requested position or trajectory of the positionable component 290 would require a displacement of shuttle 120 that is less than the maximum amplitude of fine actuator assembly 250, then system controller 290 may actuate only fine actuator assembly 250 to achieve the requested position or trajectory of the positionable component. However, if the requested position or trajectory of the positionable component 290 would require a displacement of shuttle 120 from the initial position that is greater than the maximum amplitude of fine actuator assembly 250, then system controller actuator 290 may actuate coarse actuator assembly 200 (coarse actuator assembly 200 having a greater maximum amplitude than fine actuator assembly 250) or both coarse actuator assembly 200 and fine actuator assembly 250 concurrently to achieve maximum positioning accuracy.

As an example, coarse actuator assembly 200 and fine actuator assembly 250 may each have an associate positioning error with the positioning error of fine actuator assembly 250 being less than the positioning error of coarse actuator assembly 200. In some embodiments, the coarse actuator assembly 200 may have a positioning error of approximately 10 microns (μm) while the fine actuator assembly 250 may have a positioning error of approximately 10 nm; however, in other embodiments, the positioning error of assemblies 200, 250 may vary. The requested position or trajectory provided by the user or controller of precision device 10 may include a maximum allowable positioning error. If the maximum allowable positioning error is less than the positioning error associated with coarse actuator assembly 200, then system controller 290 may operate both actuator assemblies 200, 250 to reduce the positioning error of the positionable component such that it is less than maximum allowable positioning error. For example, fine actuator assembly 250 may correct a yaw of shuttle 120 about vertical axis 111 that is introduced by the actuation of coarse actuator assembly 200. Additionally, fine actuator assembly 250 may correct a positioning error along motion axis 105 introduced by the actuation of coarse actuator assembly 200. Further, fine actuator assembly 250 may, through the varying of pressure, flowrate, and/or flow direction of fluid in fluid circuit 265, tune dynamic properties of motion platform 102 (e.g., stiffness, damping coefficient, natural frequency, etc.) so as to minimize the positioning error of the positionable component. As an alternative, rather than communicating a maximum allowable positioning error to system controller 290 of positioning system 100, precision device 10 may be operated in a maximum performance mode which invokes the concurrent actuation of coarse actuator assembly 200 and fine actuator assembly 250 by system controller 290.

Figure 11:
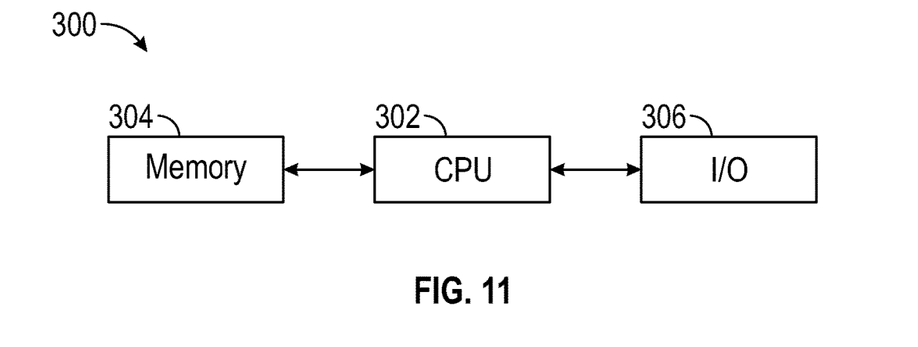
FIG. 11 is a schematic view of a computer system according to some embodiments.

Referring to FIG. 11, an embodiment of a computer system 300 suitable for implementing one or more embodiments disclosed herein is shown. For example, components of the system 100 (e.g., coarse actuator controller 210, pressure controller 260, system controller 290, etc.) shown in FIG. 1 may be configured in a manner similar to the computer system 300 shown in FIG. 11. The computer system 300 includes a processor 302 (which may be referred to as a central processor unit or CPU) that is in communication with one or more memory devices 304, and input/output (I/O) devices 306. The processor 302 may be implemented as one or more CPU chips. The memory devices 304 of computer system 300 may include secondary storage (e.g., one or more disk drives, etc.), a non-volatile memory device such as read only memory (ROM), and a volatile memory device such as random access memory (RAM). In some contexts, the secondary storage ROM 306, and/or RAM comprising the memory devices 304 of computer system 300 may be referred to as a non-transitory computer readable medium or a computer readable storage media. I/O devices 306 may include printers, video monitors, liquid crystal displays (LCDs), touch screen displays, keyboards, keypads, switches, dials, mice, and/or other well-known input devices.

It is understood that by programming and/or loading executable instructions onto the computer system 300, at least one of the CPU 302, the memory devices 304 are changed, transforming the computer system 300 in part into a particular machine or apparatus having the novel functionality taught by the present disclosure. Additionally, after the computer system 300 is turned on or booted, the CPU 302 may execute a computer program or application. For example, the CPU 302 may execute software or firmware stored in the memory devices 304. During execution, an application may load instructions into the CPU 302, for example load some of the instructions of the application into a cache of the CPU 302. In some contexts, an application that is executed may be said to configure the CPU 302 to do something, e.g., to configure the CPU 302 to perform the function or functions promoted by the subject application. When the CPU 302 is configured in this way by the application, the CPU 302 becomes a specific purpose computer or a specific purpose machine.

Figure 12:
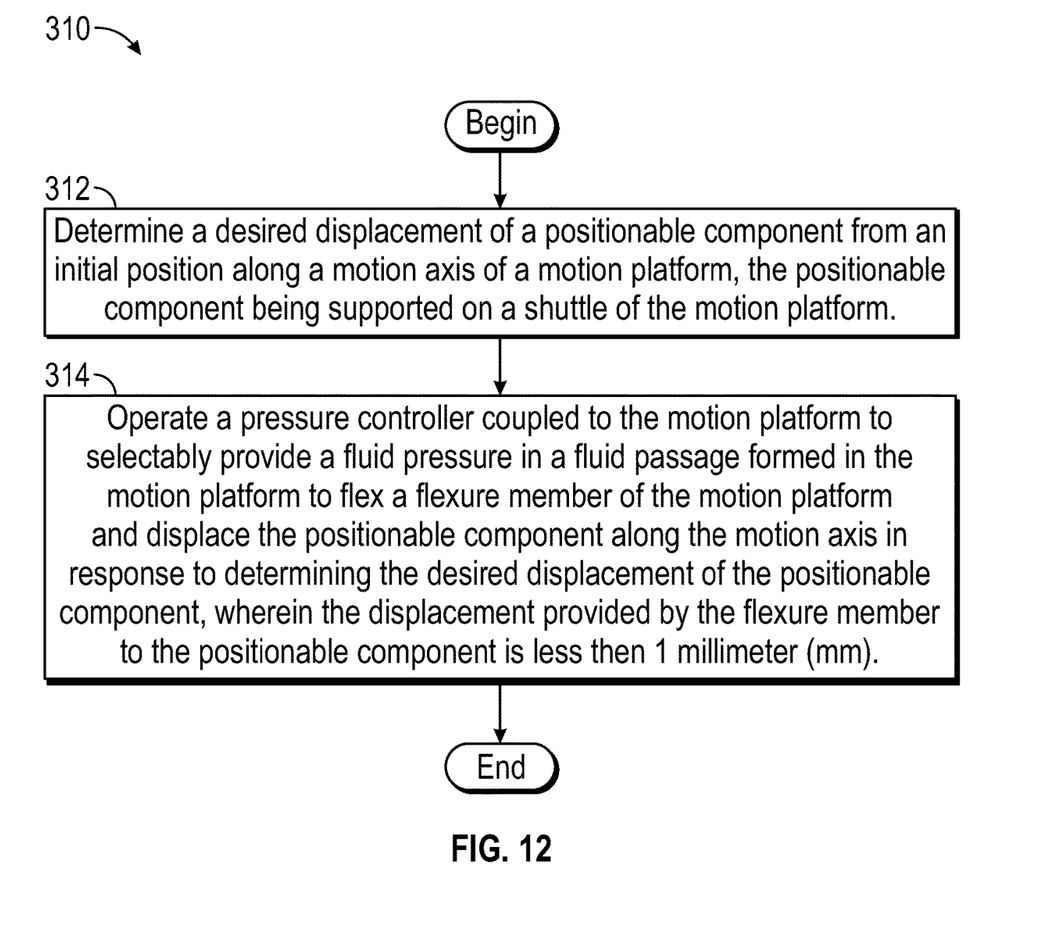
FIG. 12 is a flowchart of a method for positioning a positionable component according to some embodiments.

Referring now to FIG. 12, a flowchart of a method 310 for positioning a positionable component is shown. Initially, method 310 includes at block 312 determining a desired displacement of the positionable component from an initial position along a motion axis of a motion platform (e.g., motion platform 102 shown in FIGS. 1-8), the positionable component being supported on a shuttle (e.g., shuttle 120 shown in FIGS. 1-8) of the motion platform. Additionally, method 310 includes at block 314 operating a pressure controller (e.g., pressure controller 260 shown in FIG. 1) coupled to the motion platform to provide a fluid pressure in a fluid passage (e.g., one of fluid passages 140A, 140B shown in FIGS. 1, 7, and 8) formed in the motion platform to flex a flexure member (e.g., flexure members 118A, 118B shown in FIGS. 1-7) of the motion platform and displace the positionable component along the motion axis in response to determining the desired displacement of the positionable component, wherein the displacement provided by the flexure member to the positionable component is les than 1 mm.

While embodiments of the disclosure have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A nanoscale positioning system for positioning a positionable component, comprising:
   a motion platform comprising a first end, a second end, a shuttle positioned between the first end and the second end and configured to support the positionable component, a flexure member, and a fluid passage extending through the flexure member from the first end to the second end of the motion platform; and
   a pressure controller coupled to the motion platform and fluidically connected to the fluid passage, wherein the pressure controller is configured to selectably provide a fluid pressure in the fluid passage to flex the flexure member whereby the shuttle is displaced along a motion axis of the motion platform.

2. The positioning system of claim 1, wherein the motion platform is monolithically formed from an additively manufactured material, and the fluid passage is defined by one or more inner surfaces of the motion platform.

3. The positioning system of claim 1, wherein:
   the motion platform comprises a first fixed end coupled to a fixture, and a second fixed end coupled to the fixture;
   the motion platform comprises a pair of the flexure members extending from the first fixed end to the second fixed end and a pair of the fluid passages, the pair of the flexure members being bilaterally symmetrical across the motion axis and the pair of the passages extending through the pair of the flexure members; and
   the shuttle is positioned between the pair of the flexure members.

4. The positioning system of claim 1, wherein the positioning system comprises a fine actuator assembly comprising a fluid conduit coupled to the motion platform and which forms a closed fluid circuit with the fluid passage, and wherein the pressure controller is positioned along the fluid conduit and is configured to provide a continuous flow of fluid along the fluid circuit.

5. The positioning system of claim 4, further comprising a coarse actuator assembly coupled to the motion platform and configured to displace the shuttle along the motion axis, wherein the coarse actuator assembly comprises a maximum amplitude which is greater than a maximum amplitude of the fine actuator assembly.

6. The positioning system of claim 5, wherein the coarse actuator assembly comprises an electromechanical actuator configured to act against an end of the shuttle.

7. The positioning system of claim 5, further comprising a system controller configured to operate both the coarse actuator assembly and the fine actuator assembly simultaneously.

8. The positioning system of claim 1, wherein the pressure controller is configured to provide a fluid flow through the fluid passage to transport heat away from the motion platform.

9. A method for positioning a positionable component, comprising:
   (a) determining a desired displacement of the positionable component from an initial position along a motion axis of a motion platform, the positionable component being supported on a shuttle of the motion platform; and
   (b) operating a pressure controller coupled to the motion platform to selectably provide a fluid pressure in a fluid passage formed in the motion platform to flex a flexure member of the motion platform and displace the positionable component along the motion axis in response to determining the desired displacement of the positionable component, wherein the displacement provided by the flexure member to the positionable component is less than 1 millimeter (mm).

10. The method of claim 9, wherein the motion platform is monolithically formed and additively manufactured.

11. The method of claim 9, further comprising:
   (c) operating an electromechanical linear actuator to act against an end of the shuttle and displace the shuttle along the motion axis.

12. The method of claim 11, wherein the pressure controller is operated simultaneously with the linear actuator to correct a positioning error introduced by the linear actuator.

* * * * *